US008605180B2

United States Patent
Shimizu

(10) Patent No.: US 8,605,180 B2
(45) Date of Patent: Dec. 10, 2013

(54) POWER GATE CIRCUIT, SOLID-STATE IMAGING DEVICE, AND CAMERA SYSTEM

(75) Inventor: Kouji Shimizu, Fukuoka (JP)

(73) Assignee: Sony Corporation, Tokyo (JP)

( * ) Notice: Subject to any disclaimer, the term of this patent is extended or adjusted under 35 U.S.C. 154(b) by 219 days.

(21) Appl. No.: 13/137,611

(22) Filed: Aug. 30, 2011

(65) Prior Publication Data

US 2012/0062775 A1 Mar. 15, 2012

(30) Foreign Application Priority Data

Sep. 14, 2010 (JP) ................................. 2010-205786

(51) Int. Cl.
*H04N 5/335* (2011.01)
*H01L 27/00* (2006.01)

(52) U.S. Cl.
USPC ...................................... 348/302; 250/208.1

(58) Field of Classification Search
None
See application file for complete search history.

(56) References Cited

U.S. PATENT DOCUMENTS

| 2004/0263237 | A1* | 12/2004 | Kim et al. ...................... 327/530 |
| 2006/0214722 | A1* | 9/2006 | Hirose et al. .................. 327/407 |
| 2008/0284250 | A1* | 11/2008 | Makino et al. .................. 307/80 |
| 2008/0296977 | A1 | 12/2008 | Kawasaki |
| 2009/0251171 | A1* | 10/2009 | Butts et al. ...................... 326/33 |
| 2011/0025871 | A1* | 2/2011 | Yoshioka .................... 348/222.1 |

FOREIGN PATENT DOCUMENTS

| JP | 2008-034667 | 2/2008 |
| JP | 2008-300696 | 12/2008 |

* cited by examiner

Primary Examiner — Lin Ye
Assistant Examiner — John H Morehead, III
(74) Attorney, Agent, or Firm — Sony Corporation

(57) ABSTRACT

A power gate circuit includes: a power gate switch connected at least between a reference potential terminal of a circuit to be power-gated and a reference potential or between a power supply terminal of the circuit to be power-gated and a power supply; a capacity connected to a gate of the power gate switch; a pulse generating section supplying a pulse signal to the gate of the power gate switch according to a control signal; and a power gate control section outputting the control signal to the pulse generating section to supply the pulse signal to the gate of the power gate switch when the power gate switch is turned on and accumulating electrical charges in the capacity to control a gate potential of the power gate switch such that the potential gradually approaches a potential at which the power gate switch is turned on.

11 Claims, 10 Drawing Sheets

MODEL OF CURRENT FLOWING WHEN POWER SUPPLY IS TURNED ON

MODEL OF CURRENT FLOWING WHEN POWER SUPPLY
OF MULTI-STAGE POWER GATE IS TURNED ON

MODEL OF CURRENT FLOWING WHEN POWER SUPPLY OF
SWITCH PULSE CONTROLLED POWER GATE IS TURNED ON

POWER GATE CIRCUIT, SOLID-STATE IMAGING DEVICE, AND CAMERA SYSTEM

FIELD

The preset disclosure relates to a power gate circuit and a solid-state imaging device and a camera system utilizing the power gate circuit.

BACKGROUND

For the purpose of reducing power consumption, a gate circuit called a power gate circuit is disposed between a power supply and the ground to suppress a leak current from an unused circuit in a standby state by disconnect the circuit from the power supply through switch control.

FIG. 1 is a diagram showing a schematic exemplary configuration of a common power gate.

In the power gate circuit 1 shown in FIG. 1, a circuit 2 of interest is connected to a power supply potential VDD, and a power gate switch 3 constituted by an NMOS transistor is connected between an virtual ground VGND of the circuit 2 and the ground GND.

FIG. 1 shows an example of isolation of the circuit from the ground GND, and the power gate switch 3 may alternatively be inserted between the power supply VDD and the circuit 2 of interest.

When the circuit 2 is in a standby state, a leak current can flow and a standby current can increase if no power gate is provided. The circuit 2 is electrically isolated from the power supply and the ground GND to suppress a leak current by turning the power gate circuit off using a power gate control circuit 4 in the standby state.

FIG. 2 is a graph showing a model of a current that flows when the power supply of the power gate circuit in FIG. 1 is turned on.

When the power gate switch 3 is turned from off to on, a rush current flows as show in FIG. 2, and the current may exceed an upper limit for a current flowing through the circuit 2.

A known method of suppressing such a rush current is the use of a multi-stage power gate circuit having a multiplicity of power gate stages which are separately controlled (see JP-A-2008-300696 and JP-A-2008-34667 (Patent Documents 1 and 2)).

FIG. 3 is a diagram of a multi-stage power gate circuit.

FIG. 4 is a graph showing a model of a current that flows when the power supply of the multi-stage power gate circuit is turned on.

In order to suppress a rush current in the system shown in FIG. 1, power gate switches 3-1 to 3-3 are grouped into a multiplicity of stages (three stages in this case), and those stages are independently controlled by the power gate control circuit 4.

When timing control is exercised such that power gate circuits 3-1, 3-2, and 3-3 in such a system are sequentially turned on, a rush current is suppressed as shown in FIG. 4.

SUMMARY

As shown in FIGS. 1 and 2, the common power gate circuit 1 is connected to the power supply under control exercised using a switch when the circuit is used. A rush current generated when the switch is turned on can exceed an upper limit for a current flowing through an element forming apart of the circuit to be power-gated, and instantaneous breakdown of the circuit can occur. Attention must be paid for such a possibility when the circuit is designed.

One known solution is to form a multiplicity of power gate switch stages and to control those stages separately such that a rush current will be suppressed.

However, in the case of such an approach employing a multiplicity of stages, attention must be paid to the preparation of an area required for MOS transistors serving as power gate switches to accommodate the split stages, the insertion of functional circuits for controlling the stages independently, and the insertion of a negative feedback circuit required in consideration to variation between the stages.

A rush current may exceed an upper limit for a current flowing through a functional circuit depending on the number of stages and variation between the transistors.

Another known solution is to insert capacities to the gates of MOS transistors to be used as switches of power gate circuits, thereby keeping the through rate of biased voltages small.

However, a great capacity is required for filtering a rush current, and a sufficient area must be pre'pared for capacities having such a great magnitude.

It is therefore desirable to provide a power gate circuit, a solid-state imaging device, and a camera system in which a rush current at the time of power on can be properly suppressed without increasing the area and complexity of control.

An embodiment of the present disclosure is directed to a power gate circuit including a power gate switch connected at least between a reference potential terminal of a circuit to be power-gated and a reference potential or between a power supply terminal of the circuit to be power-gated and a power supply, a capacity connected to a gate of the power gate switch, a pulse generating section supplying a pulse signal to the gate of the power gate switch according to a control signal, and a power gate control section outputting the control signal to the pulse generating section to supply the pulse signal to the gate of the power gate switch when the power gate switch is turned on and accumulating electrical charges in the capacity to control a gate potential of the power gate switch such that the potential gradually approaches a potential at which the power gate switch is turned on.

Another embodiment of the present disclosure is directed to a solid-state imaging device including a pixel section having a plurality of pixels performing photoelectric conversion arranged in the form of a matrix and a pixel signal readout section reading pixel signals from the pixel section, the pixels being read in groups each formed by a plurality of pixels, the pixel signal readout section including an AD conversion portion performing analog-digital (AD) conversion. The pixel signal readout section includes a plurality of comparators comparing a reference signal that is a ramp wave with the potential of an analog signal read out from a pixel of a column associated therewith, a plurality of counter latches disposed in association with the plurality of comparators, capable of counting the comparison times of the respective comparators, the counter latches stropping counting and holding count values when the output of the respective comparators is inverted, and a power gate circuit serving the plurality of counter latch circuits. The power gate circuit includes a power gate switch connected at least between a reference potential terminal of a circuit to be power-gated and a reference potential or between a power supply terminal of the circuit to be power-gated and a power supply, a capacity connected to a gate of the power gate switch, a pulse generating section supplying a pulse signal to the gate of the power gate switch according to a control signal, and a power gate control section outputting the control signal to the pulse generating section to supply the pulse signal to the gate of the power gate switch when the power gate switch is turned on and accumulating electrical charges in the capacity to control a gate potential of the power gate switch such that the potential gradually approaches a potential at which the power gate switch is turned on.

Still another embodiment of the present disclosure is directed to a camera system including a solid-state imaging device and an optical system forming an object image on the solid-state imaging element. The solid-state imaging device includes a pixel section having a plurality of pixels performing photoelectric conversion arranged in the form of a matrix and a pixel signal readout section reading pixel signals from the pixel section. The pixels are read in groups each formed by a plurality of pixels. The pixel signal readout section includes an AD conversion portion performing analog-digital (AD) conversion. The pixel signal readout section includes a plurality of comparators comparing a reference signal that is a ramp wave with the potential of an analog signal read out from a pixel of a column associated therewith, a plurality of counter latches disposed in association with the plurality of comparators, capable of counting the comparison times of the respective comparators, the counter latches stropping counting and holding count values when the output of the respective comparators is inverted, and a power gate circuit serving the plurality of counter latch circuits. The power gate circuit includes a power gate switch connected at least between a reference potential terminal of a circuit to be power-gated and a reference potential or between a power supply terminal of the circuit to be power-gated and a power supply, a capacity connected to a gate of the power gate switch, a pulse generating section supplying a pulse signal to the gate of the power gate switch according to a control signal, and a power gate control section outputting the control signal to the pulse generating section to supply the pulse signal to the gate of the power gate switch when the power gate switch is turned on and accumulating electrical charges in the capacity to control a gate potential of the power gate switch such that the potential gradually approaches a potential at which the power gate switch is turned on.

According to the embodiments of the present disclosure, it is possible to provide a power gate circuit capable of properly suppressing a rush current when a power supply is tuned on without occupying a large space and requiring complicated control.

BRIEF DESCRIPTION OF THE DRAWINGS

FIG. 2 is a graph showing a model of a current that flows when the power supply of the power gate circuit in FIG. 1 is turned on;

FIG. 4 is a graph showing a model of a current that flows when the power supply of the multi-stage power gate circuit is turned on;

FIG. 8 is a graph showing a model of a current that flows when the power supply of the power gate circuit of the embodiment is turned on;

DETAILED DESCRIPTION

Embodiments of the present disclosure will now be described.

The following items will be described in the order listed.
1. First Embodiment (First Exemplary Configuration of Power Gate Circuit)
2. Second Embodiment (Second Exemplary Configuration of Power Gate Circuit)
3. Third Embodiment (Third Exemplary Configuration of Power Gate Circuit)
4. Fourth Embodiment (Exemplary Application of Power Gate Circuit to Solid-State Imaging Device (Semiconductor Device))
5. Fifth Embodiment (Camera System)

1. First Embodiment

Figure 5:
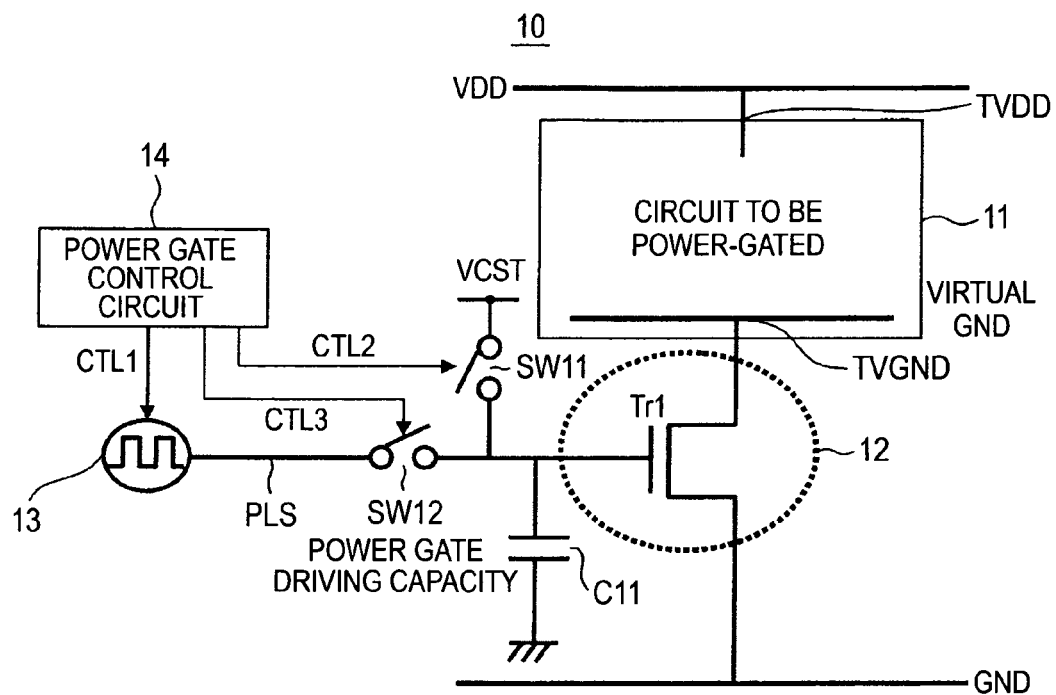
FIG. 5 is a diagram showing an exemplary configuration of a power gate circuit according to a first embodiment of the present disclosure.

FIG. 5 is a diagram showing an exemplary configuration of a power gate circuit according to a first embodiment of the present disclosure.

A power gate circuit 10 includes a circuit 11 to be power-gated, a power gate switch 12, a pulse generating section 13, a power gate control circuit 14, a power gate driving capacity C11, and switches SW11 and SW12.

The circuit 11 to be power-gated includes a power supply terminal TVDD and a virtual ground terminal TVGND which is a reference potential terminal.

The circuit 11 to be power-gated of the present embodiment is connected to a power supply potential VDD at the power supply terminal TVDD thereof, and a power gate switch 12 constituted by an NMOS transistor is connected between the virtual ground terminal TVGND and ground GND.

A drain of the power gate switch 12 is connected to the virtual ground terminal TVGND of the circuit 11 to be power-gated, and a source of the switch is connected to the ground GND.

A first electrode (one terminal) of the capacity C11 is connected to a gate of the power gate switch 12, and a second electrode (another terminal) of the capacity C11 is grounded.

The gate of the power gate switch 12 is selectively connected to a constant potential VCST through the switch SW11. The gate of the power gate switch 12 is selectively connected to a supply line for a pulse signal PLS through the switch SW12.

The constant potential VCST is a DC voltage source which allows the power gate switch 12 constituted by an NMOS transistor to be kept on with stability, and the power supply potential VDD may serve as such a constant potential.

While the description is based on an assumption that the power gate switch 12 is an NMOS transistor, a PMOS transistor may alternatively be used.

The pulse generating section 13 supplies a pulse signal PLS to the gate of the power gate switch 12 through the switch SW12 according to a control signal CTL1 from the power gate control circuit 14.

During the period in which the pulse signal PLS is supplied to the gate of the power gate switch 12, the switch SW11 is kept off by a control signal CTL2 from the power gate control circuit 14, and the switch SW12 is kept on by a control signal CTL3 from the power gate control circuit 14.

The power gate control circuit 14 exercises control such that the power gate switch 12 is turned on when the circuit 11 to be power-gated enters an operating state from a standby state.

The power gate control circuit 14 outputs the control signal CTL1 to the pulse generating section 13 and turns the switch SW12 on by the control signal CTL3 to supply the pulse signal PLS to the gate of the power gate switch 12.

Thus, the power gate control circuit 14 accumulates electrical charges in the capacity C11 to control a gate potential of the power gate switch 12 such that the gate potential gradually approaches a potential at which the power gate switch 12 is turned on. In this example, control is exercised such that the gate potential gradually increases.

The power gate control circuit 14 can change the pulse width of the pulse signal PLS from the pulse generating section 13 using the control signal CTL1.

The power gate control circuit 14 changes the pulse width of the pulse signal PLS from the pulse generating section 13 using the control signal CTL1 according to a mode signal MODE.

Figure 6:
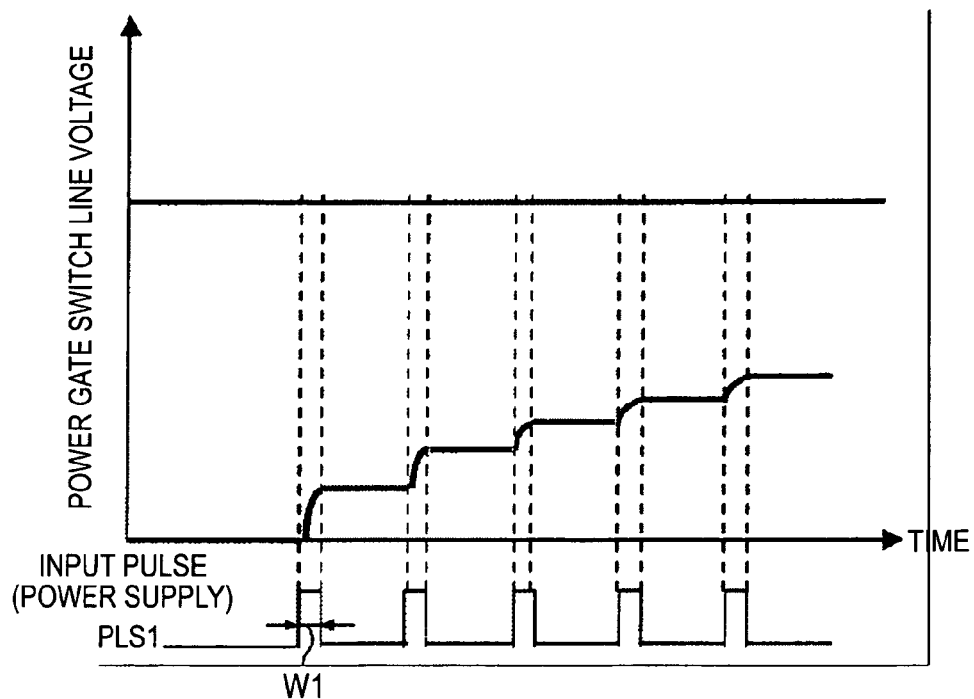
FIG. 6 is a graph schematically showing a pulse signal generated in a first mode and resultant transitions of a gate potential of a power gate switch.

FIG. 6 is a graph schematically showing a pulse signal generated in a first mode and resultant transitions of the gate potential of the power gate switch.

Figure 7:
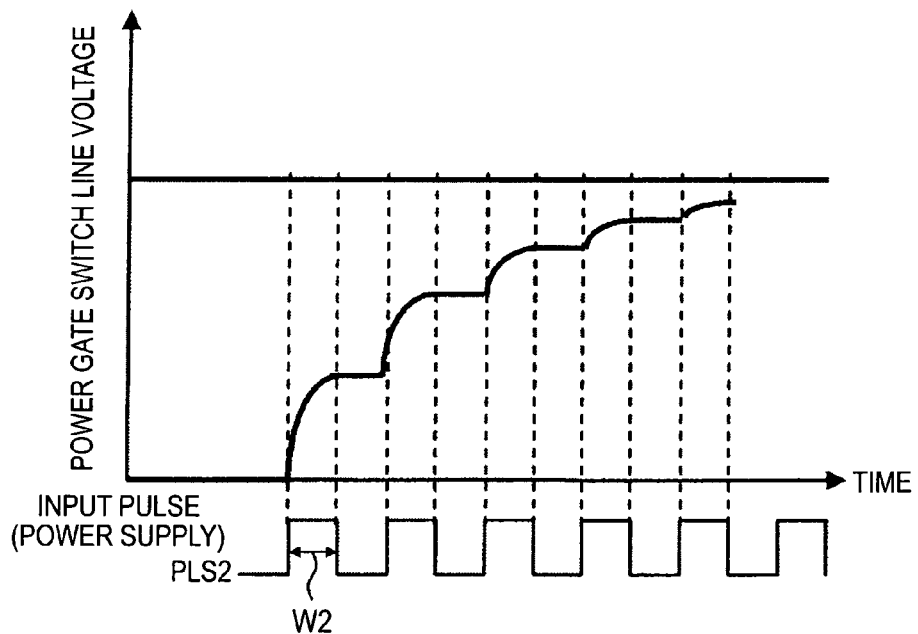
FIG. 7 is a graph schematically showing a pulse signal generated in a second mode and resultant transitions of the gate potential of the power gate switch.

FIG. 7 is a graph schematically showing a pulse signal generated in a second mode and resultant transitions of the gate potential of the power gate switch.

A pulse signal PLS1 generated in the first mode shown in FIG. 6 has a pulse width W1 which is greater than a pulse width W2 of a pulse signal PLS2 generated in the second mode shown in FIG. 7.

The different pulse widths cause different amounts of effective electrical charges to be accumulated in the capacity C11, and the gate potential of the power gate switch 12 increases at a higher rate in the first mode than in the second mode.

In other words, the gate potential of the power gate switch 12 increases at a lower rate in the second mode than in the first mode.

As thus described, in the present embodiment, the time required for the gate potential of the power gate switch 12 to reach the turn-on potential of the switch can be adjusted according to the mode signal MODE.

When the pulse signal PLS has been supplied for a certain period of time, the power gate control circuit 14 controls the control signal CTL1 to stop the generation of the pulse. The control circuit turns the switch SW12 off by the control signal CTL3 and turns the switch SW11 on by the control signal CTL2.

Thus, when the pulse signal PLS has been supplied for a certain period of time, the power gate control circuit 14 sets the gate of the power gate switch 12 at the constant potential VCST instead of supplying the pulse signal PLS.

In this configuration, in the standby state, the switches SW11 and SW12 are turned off by the control signals CTL2 and CTL3 under control exercised by the power gate control circuit 14 to turn the power gate switch 12 off.

As a result, the circuit 11 to be power-gated is electrically isolated from the power supply and the ground GND to suppress the generation of a leak current.

When the circuit 11 to be power-gated enters the operating state from the standby sate, the power gate control circuit 14 exercises control to turn the power gate switch 12 on.

The control signal CTL1 is output from the power gate control circuit 14 to the pulse generation circuit 13, and the switch SW12 is turned on by the control signal CTL3 to supply the pulse signal PLS to the gate of the power gate switch 12.

Thus, electrical charges are gradually accumulated at the capacity C11, and the gate potential of the power gate switch 12 gradually increases toward a potential at which the power gate switch 12 is turned on.

Figure 8:
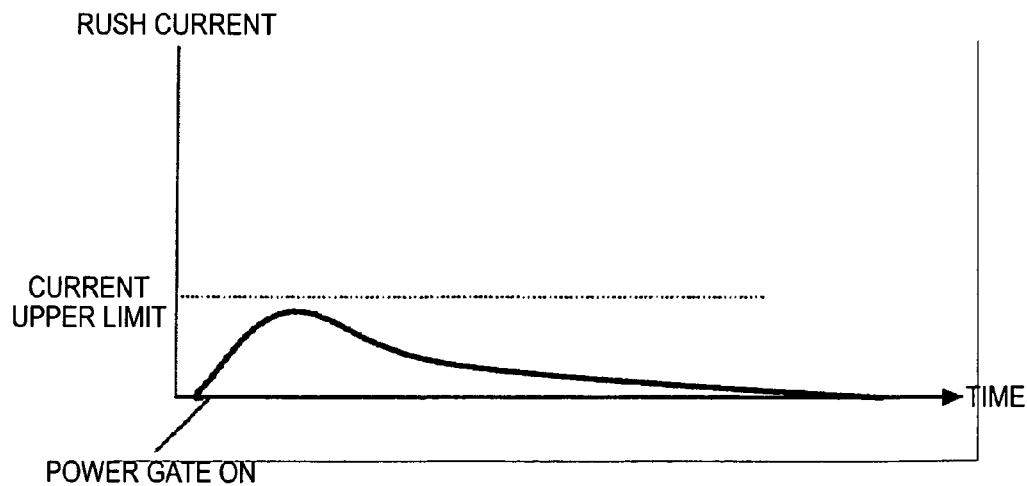

Electrical charges are accumulated at the power gate driving capacity C11 by the pulse signal PLS as thus described to suppress the generation of a rush current as shown in FIG. 8.

Since pulse control is employed, the power gate driving capacity C11 may be a small capacity.

The slew rate can be controlled as shown in FIGS. 6 and 7 by varying the duty of the pulse.

Figure 1:
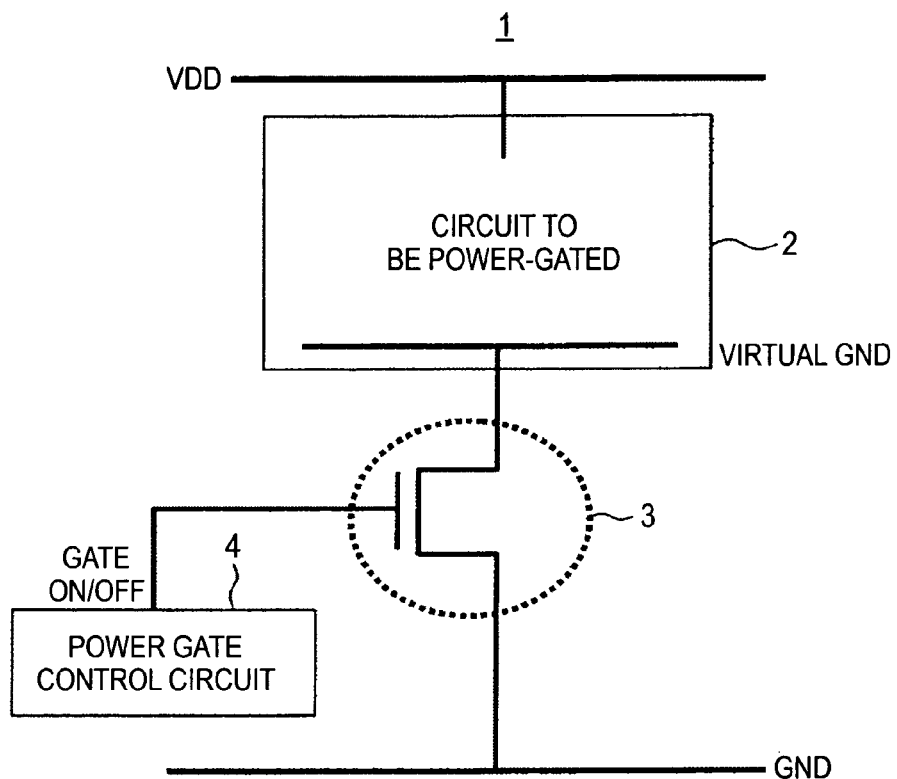
FIG. 1 is a diagram showing a schematic exemplary configuration of a common power gate.
Figure 2:
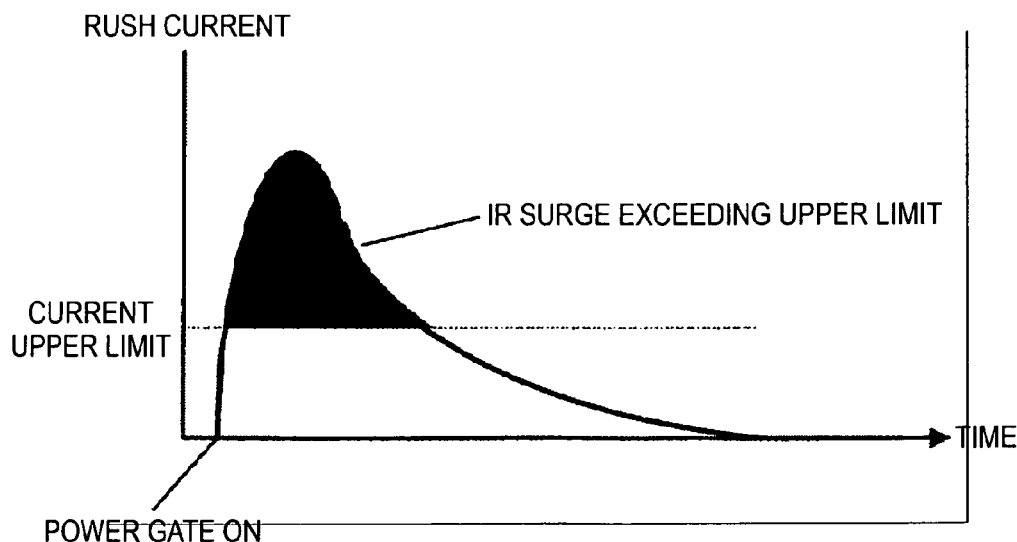
Figure 3:
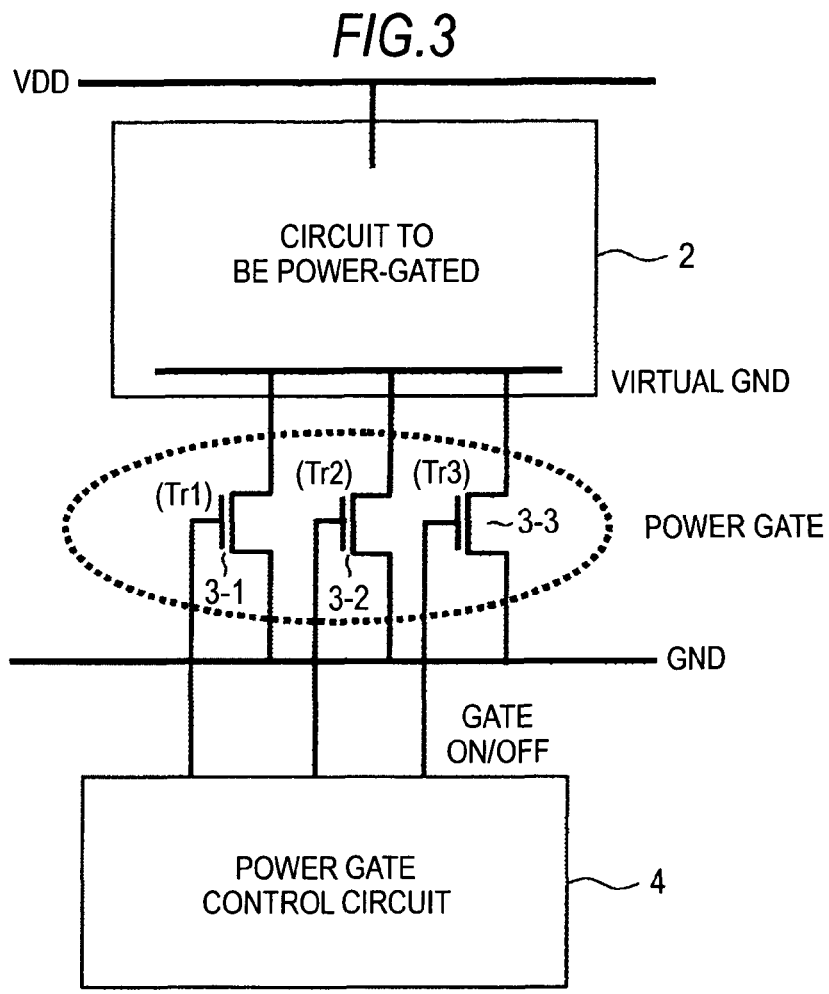
FIG. 3 is a diagram showing an exemplary configuration of a multi-stage power gate circuit.
Figure 4:
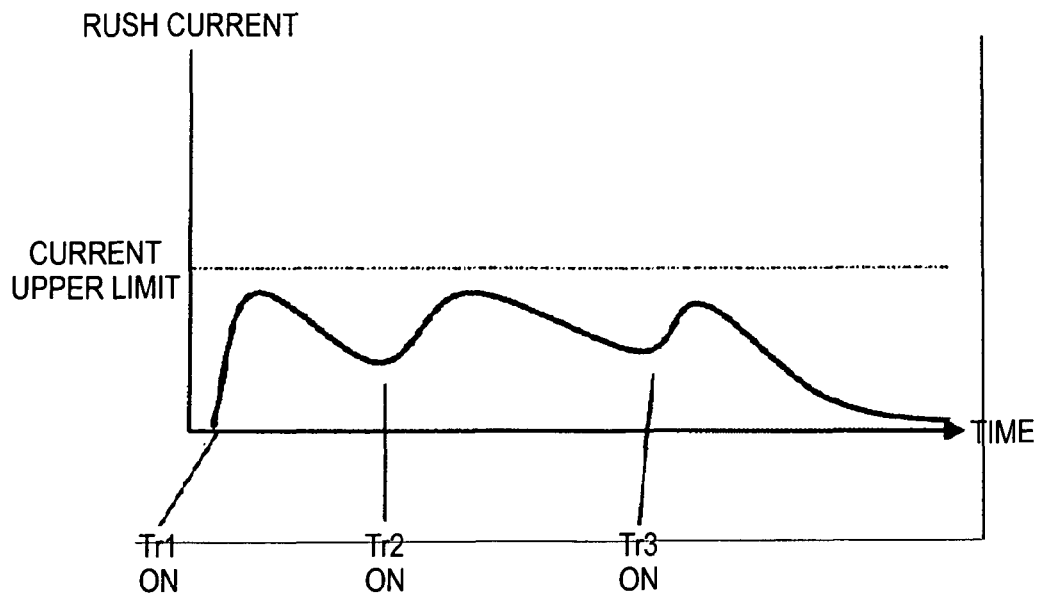

There is no need for providing a control circuit such as the multi-stage power gate shown in FIG. 3, which is advantageous in terms of the scale of the circuit and the area occupied by the circuit.

As will be apparent from the above description, the first embodiment of the present disclosure provides the following advantages.

Since the power gate circuit is activated by accumulating electrical charges at a capacity inserted in switch lines thereof using a pulse, the amount of electrical charges accumulated at a time is very small, and the approach therefore necessitates a smaller capacity for accumulating electrical charges compared to existing methods in the related art.

Since the voltage level at which the switch is turned on is reached by a plurality of operations of accumulating a small amount of electrical charges, a low slew rate can be achieved.

It is also possible to adjust the slew rate by changing the duty of the pulse width.

The capacity inserted in the switch line also serves as a filter which allows power supply noise to be suppressed.

The embodiment can be implemented as a small-scale circuit because it eliminates the need for features required in the related art, i.e., a switch gate having a great capacity, power gate switches in the form of a plurality of stages, and a functional circuit for controlling the switches.

2. Second Embodiment

Figure 9:
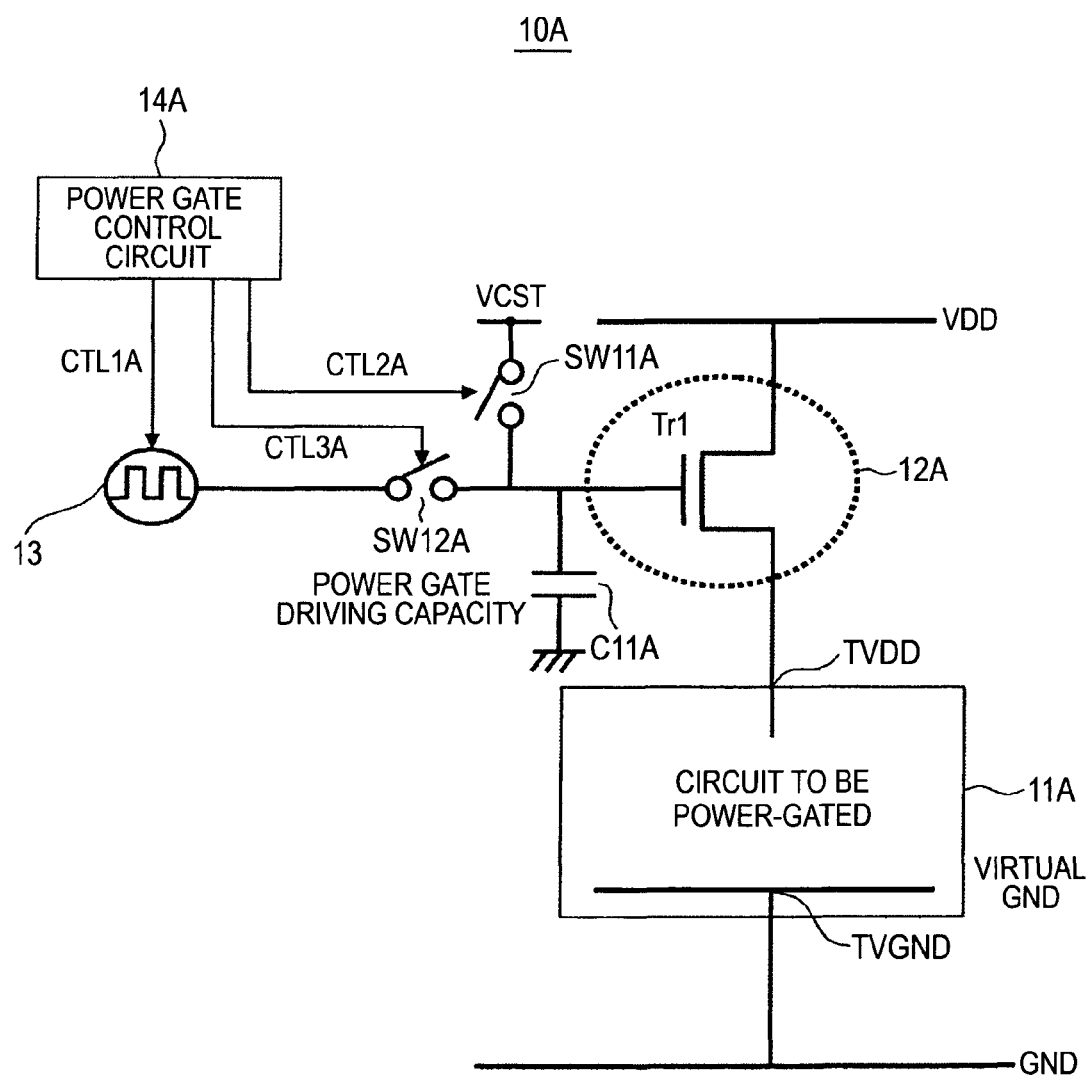
FIG. 9 is a diagram showing an exemplary configuration of a power gate circuit according to a second embodiment of the present disclosure.

FIG. 9 is a diagram showing an exemplary configuration of a power gate circuit according to a second embodiment of the present disclosure.

A power gate circuit 10A according to the second embodiment of the present disclosure is different from the power gate circuit 10 according to the first embodiment as described below.

In the first embodiment, the circuit 11 to be power-gated is connected to the power supply potential VDD at the power supply terminal TVDD thereof, and the power gate switch 12 constituted by an NMOS transistor is connected between the virtual ground terminal TVGND and the ground GND.

In the second embodiment, a power gate switch 12A constituted by an NMOS transistor is connected between a power supply terminal TVDD of a circuit 11A to be power-gated and a power supply potential VDD, and a virtual ground terminal TVGND of the switch is connected to ground GND.

The configuration and functions of this embodiment are basically similar to those of the first embodiment.

Although the embodiment is described as having a power gate switch 12A constituted by an NMOS transistor, a PMOS transistor may alternatively be used.

In such a case, a capacity C11A is connected between the gate of the power gate switch 12A and the power supply potential VDD to exercise control such that a potential at the gate will gradually decrease.

The second embodiment can provide the same advantages as those of the first embodiment.

3. Third Embodiment

Figure 10:
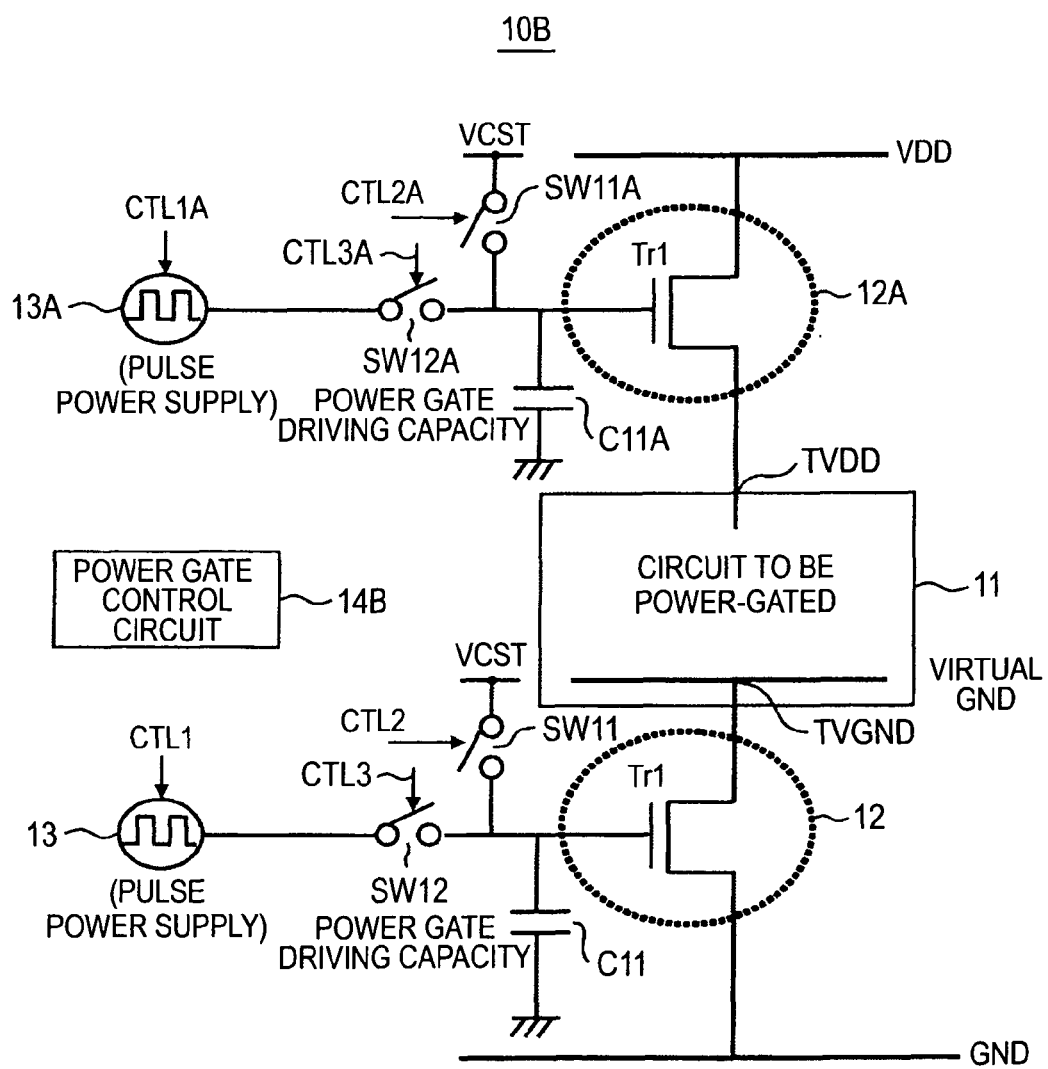
FIG. 10 is a diagram showing an exemplary configuration of a power gate circuit according to a third embodiment of the present disclosure.

FIG. 10 is a diagram showing an exemplary configuration of a power gate circuit according to a third embodiment of the present disclosure.

A power gate circuit 10B according to the third embodiment of the present disclosure has a configuration which is a combination of the configurations of the first and second embodiments.

In the third embodiment, a power gate switch 12 constituted by an NMOS transistor is connected to between a virtual ground terminal TVGND of a circuit 11B to be power-gated and ground GND.

A power gate switch 12A constituted by an NMOS transistor is connected between a power supply terminal TVDD of the circuit 11B to be power-gated and a power supply potential VDD.

The power gate switch of this embodiment may be also constituted by a PMOS transistor.

The third embodiment can provide the same advantages as those of the first embodiment, and the power gate circuit can be controlled according to specifications to be achieved.

4. Fourth Embodiment

Exemplary Application of Power Gate Circuit to Solid-State Imaging Device (Semiconductor Device)

A description will now be made on an exemplary application of the power gate circuit to a solid-state imaging device (CMOS image sensor) which is an exemplary semiconductor device.

A CMOS image sensor can be manufactured using manufacturing processes similar to those used for common CMOS integrated circuits, and the sensor can be driven by a single power supply. Further, a CMOS image sensor can be consolidated with analog circuits and logic circuits manufactured using CMOS processes in the same chip.

Therefore, a CMOS image sensor has a plurality of significant advantages such as the fact that the sensor can be used with a small number of peripheral ICs.

The main stream of CCD output circuits is one-channel output type circuits which utilize an FD (Floating Diffusion) amplifier including a floating diffusion (FD) layer.

On the contrary, the main stream of CMOS image sensors is column-parallel output type sensors which have an FD amplifier at each pixel thereof and from which output is obtained by selecting a certain row of the pixel array and reading out the pixels of the row simultaneously in the direction of columns.

It is difficult to obtain sufficient driving capability from FD amplifiers disposed at pixels of such a sensor, and the data rate of the sensor must be kept low. Parallel processing is advantageous for such a reason.

A wide variety of circuits have been proposed as circuits for reading (outputting) pixel signals from a column-parallel output type CMOS image sensor.

One of the most advanced modes of such circuits is the type of circuits including a analog-digital converter (hereinafter abbreviated as "ADC") provided in association with each column of pixels to obtain a pixel signal in the form of a digital signal.

CMOS image sensors having such column-parallel ADCs are already in practical use.

Figure 11:
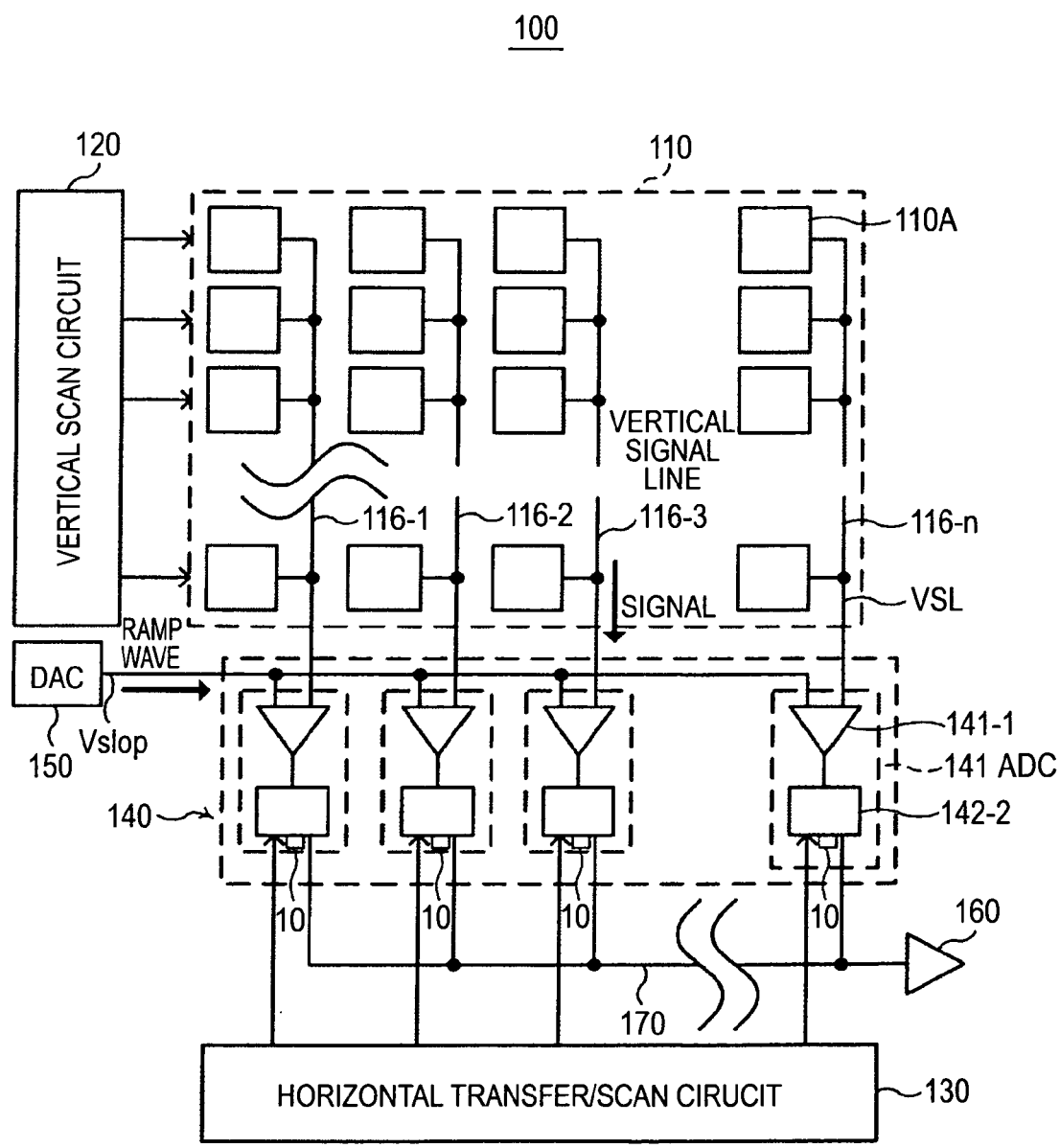
FIG. 11 is a block diagram showing an exemplary configuration of a solid-state imaging device (CMOS image sensor) having column-parallel ADCs employing a power gate circuit according to an embodiment of the present disclosure.

FIG. 11 is a block diagram showing an exemplary configuration of a solid-state imaging device (CMOS image sensor) 100 having column-parallel ADCs employing a power gate circuit according to the embodiment of the present disclosure.

As shown in FIG. 11, the solid-state imaging device 100 includes a pixel section 110, a vertical scan circuit 120, a horizontal transfer/scan circuit 130, and a column processing circuit group 140 including a group of ADCs.

Further, the solid-state imaging device 100 includes a digital-analog converter (hereinafter abbreviated as "DAC") 150 and an amplifier circuit 160.

For example, a power gate circuit according to the embodiment of the present disclosure is used for counter latches of the column processing circuit group 140 including a group of ADCs.

The pixel section 110 is constituted by a matrix-like array of unit pixels 110A each including a photo-diode (photoelectric conversion device) and an in-pixel amplifier.

[Exemplary Configuration of Unit Pixel]

Figure 12:
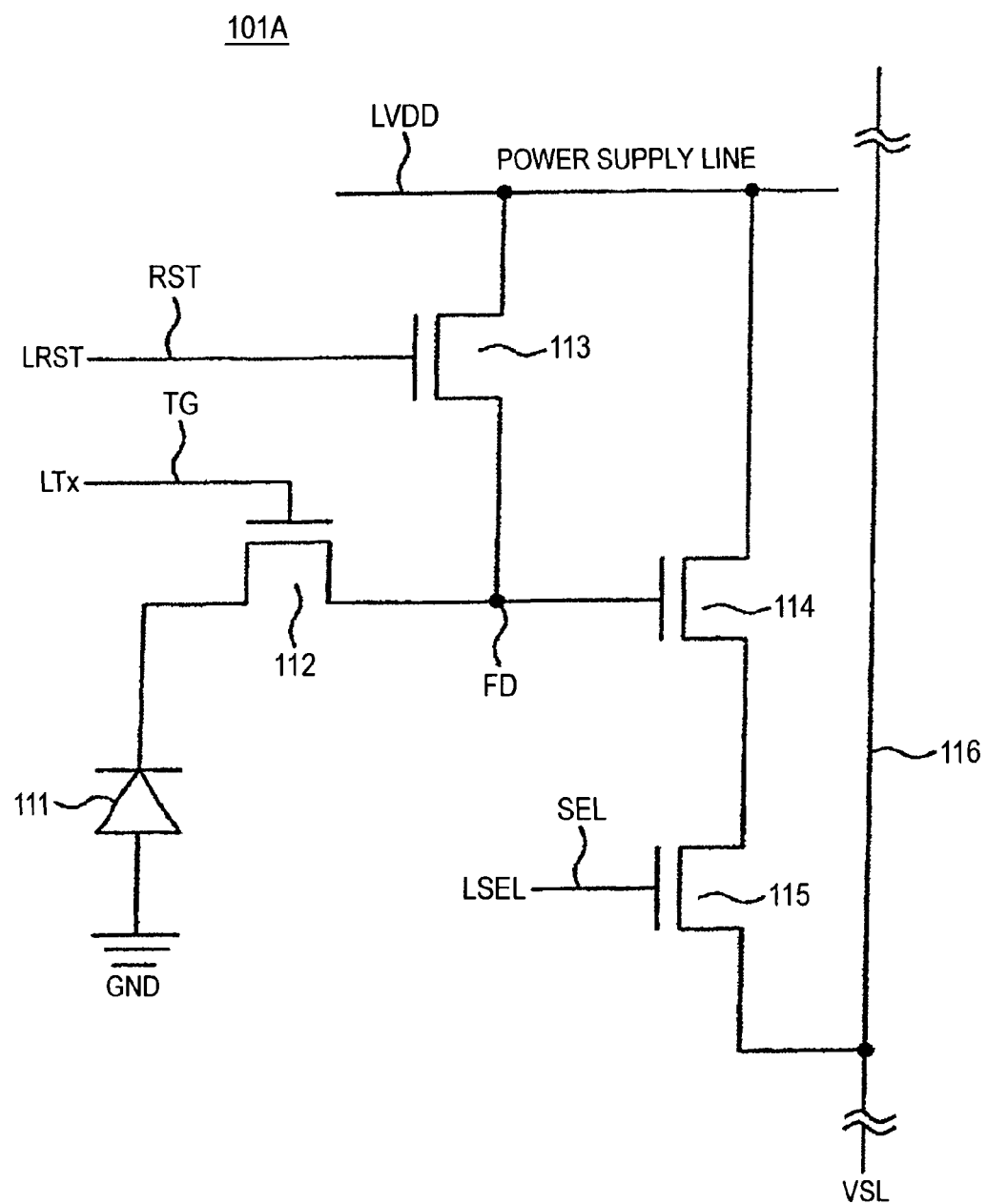
FIG. 12 is a diagram showing an example of a pixel of the CMOS image sensor according to the embodiment of the present disclosure, the pixel including four transistors.

FIG. 12 is a diagram showing an example of a unit pixel 110A of the CMOS image sensor according to the embodiment of the present disclosure, the pixel including four transistors.

The unit pixel 110A includes one photodiode 111 and four transistors as active elements associated with the photodiode, i.e., a transfer transistor 112 as a transfer element, a reset transistor 113 as a reset element, an amplification transistor 114, and a selection transistor 115.

The photodiode 111 photo-electrically converts incident light into electrical charge (which is electrons in this case) in an amount corresponding to the quantity of the incident light.

The transfer transistor 112 is connected between the photodiode 111 and a floating diffusion FD serving as an output node.

A driving signal TG is supplied to a gate (transfer gate) of the transfer transistor 112 through a transfer control line LTx. Thus, the electrons obtained as a result of photoelectric conversion at the photodiode 111 that is a photoelectric conversion element are transferred to the floating diffusion FD.

The reset transistor 113 is connected between a power supply line LVDD and the floating diffusion FD.

A reset signal RST is supplied to a gate of the reset transistor 113 through a reset control line LRST to reset the potential at the floating diffusion FD to the potential at the power supply line LVDD.

A gate of the amplification transistor 114 is connected to the floating diffusion FD. The amplification transistor 114 is connected to a vertical signal line 116 through the selection transistor 115 to form a source follower in combination with a constant current source provided outside the pixel section.

A control signal (i.e., an address signal or a select signal) SEL is supplied to a gate of the selection transistor 115 through a selection control line LSEL to turn the selection transistor 115 on.

When the selection transistor 115 is turned on, the amplification transistor 114 amplifies the potential at the floating diffusion FD to output a voltage according to the potential to the vertical signal line 116. The voltage output as thus described from each pixel through the vertical signal line 116 is output to the column processing circuit group 140 serving as a pixel signal readout circuit.

Since the gates of the transfer transistors 112, the reset transistors 113, and the selection transistors 115 of each row of pixels are connected to each other, the above-described operations simultaneously take place at the pixels on each row in parallel.

Referring to the reset control lines LRST, the transfer control lines LTx, and the selection control lines LSEL provided at the pixel section 110, one set of such lines is laid in association with each row of the pixel array.

The reset control lines LRST, the transfer control lines LTx, and the selection control lines LSEL are driven by the vertical scan circuit 120 serving as a pixel driving section.

The solid-state imaging device 100 includes the vertical scan circuit 120 which controls, serving as a control circuit for sequentially reading signals from the pixel section 110, row addressing and row scanning and the horizontal transfer/scan circuit 130 which controls column addressing and column scanning.

The column processing circuit group 140 is an array or group of columns of column processing circuits 141, each column including an ADC formed therein.

Each column processing circuit (ADC) 141 includes a comparator 141-1 for comparing a reference signal RAMP (Vslop) which is a ramp waveform obtained by changing a reference signal generated by the DAC 150 stepwise with an analog signal obtained from each row line through the vertical signal line.

Further, each column processing circuit 141 includes a counter latch (memory) 141-2 which counts the time of comparison carried out by the comparator 141-1 and holds the result of the counting.

In the present embodiment, the power gate circuit 10, 10A, or 10B as described above is used to serve such a counter latch 141-2 to save power consumption.

The column processing circuits 141 have an n-bit digital signal converting function, and the circuits are disposed in association with respective vertical signal lines (column lines) 116-1 to 116-$n$, whereby a column parallel ADC block is formed.

The output of each counter latch 141-2 is connected to a horizontal transfer line 170 having a width of, for example, k bits.

In association with the horizontal transfer line 170, k amplifier circuits 160 are provided.

Figure 13:
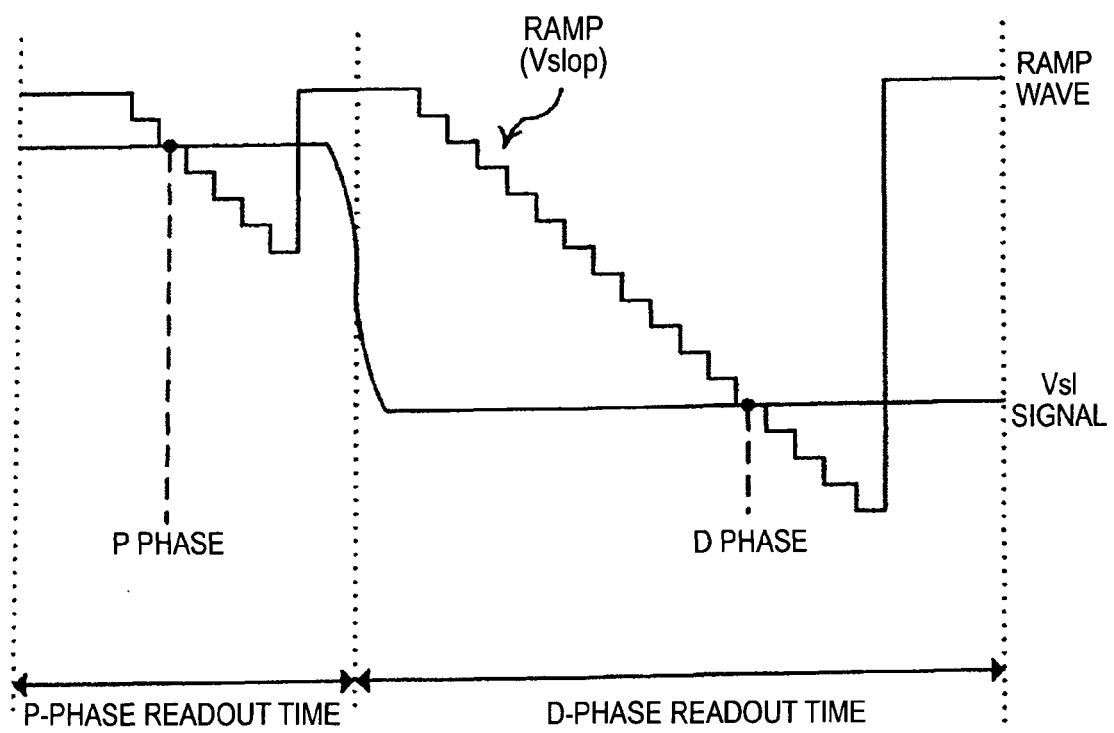
FIG. 13 is a timing chart of the circuits shown in FIG. 11.

FIG. 13 is a timing chart of the circuits shown in FIG. 11.

At each column processing circuit (ADC) 141, the comparator 141-1 disposed in the column compares an analog signal (potential Vsl) read out onto the vertical signal line 116 with the reference signal RAMP (Vslop) changing stepwise.

At this time, the counter latch 141-2 counts time until the levels of the analog potential Vsl and the reference signal RAMP (Vslop) cross each other to invert the output of the comparator 141-1, and the potential (analog signal) Vsl on the vertical signal line 116 is converted into a digital signal.

Such A-D conversion is performed twice when one readout takes place.

The first A-D conversion takes place when the reset levels (P-phase) of the unit pixels 110A are read out onto the vertical signal lines 116 (116-1 to 116-$n$).

The reset level (P-phase) of each pixel may have variation.

The second A-D conversion takes place when signals (D-phase) obtained by photoelectric conversion at the unit pixels 110A are read out onto the vertical signal lines 116 (116-1 to 116-$n$).

Since the signal in the D-phase at each pixel may also have variation, correlated double sampling (CDS) may be carried out by subtracting levels in the D-phase from levels in the P-phase.

The digital signals obtained by the conversion are recorded in the counter latches 141-2, and the signals are sequentially read out by the horizontal (column) transfer scan circuit 130 and supplied through the horizontal transfer line 170 to the amplifier circuit 160 from which the signals are finally output.

Thus, a column parallel output process is performed.

The solid-state imaging device having advantages as thus described can be used as the imaging device of a digital camera or a video camera.

4. Exemplary Configuration of Camera System

Figure 14:
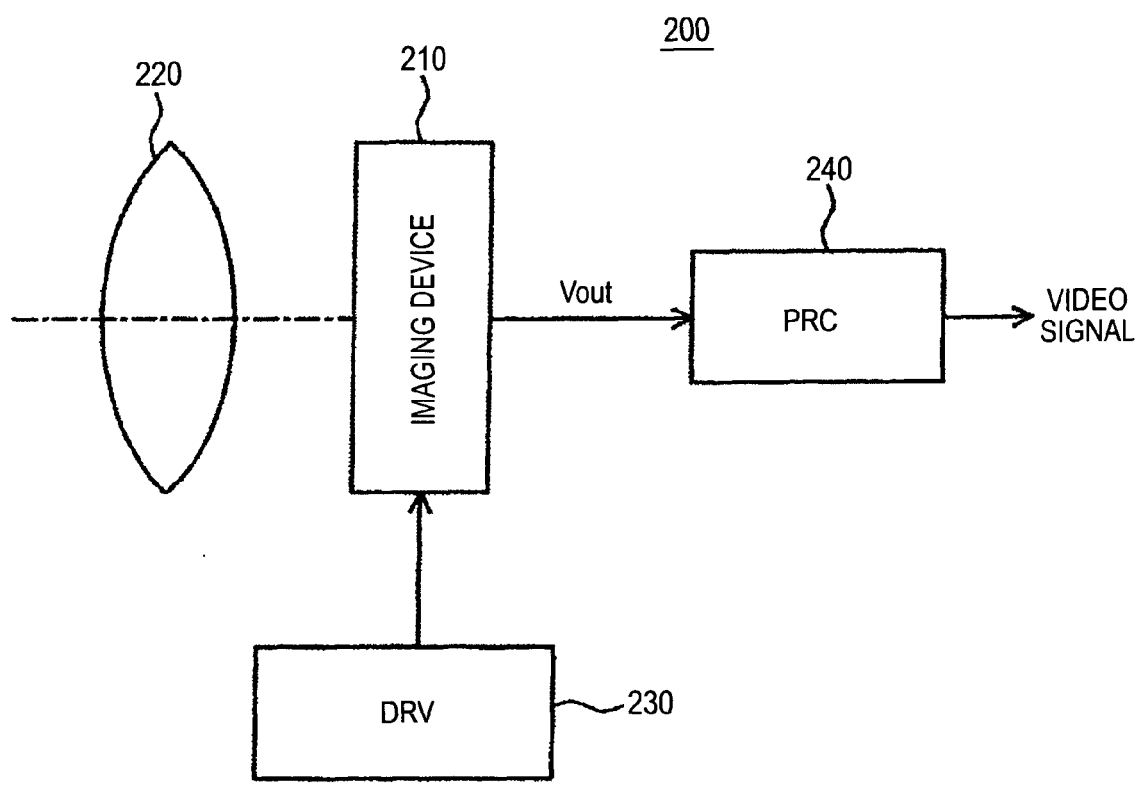
FIG. 14 is a diagram showing an exemplary configuration of a camera system employing a solid-state imaging device according to an embodiment of the present disclosure.

FIG. 14 is a diagram showing an exemplary configuration of a camera system 200 employing a solid-state imaging device according to the embodiment of the present disclosure.

As show in FIG. 14, the camera system 200 includes an imaging device 210 which may be a solid-state imaging device 100 according to the embodiment of the present disclosure.

For example, the camera system 200 includes a lens 220 forming an image of incident light (image light) on an imaging plane, as an optical system for guiding incident light to a pixel region of the imaging device 210 (for forming an object image).

Further, the camera system 200 includes a driving circuit (DRV) 230 for driving the imaging device 210 ad a signal processing circuit (PRC) 240 for processing signals output from the imaging device 210.

The driving circuit 230 includes a timing generator (not shown) generating various timing signals including a start pulse and a clock pulse for driving circuits in the imaging device 210, and the imaging device 210 is driven according to predetermined timing signals.

The signal processing circuit 240 performs predetermined processes on signals output from the imaging device 210.

An image signal which has been processed by the signal processing circuit 240 is recorded in a recording medium such as a memory. A hard copy of image information recorded in the recording medium is produced by a printer or the like. An image signal which has been processed by the signal processing circuit 240 may be displayed as a motion picture on a monitor which may be a liquid crystal display or the like.

A high-definition camera system can be obtained by loading an imaging apparatus such as a digital still camera with a solid-state imaging device 100 as described above to serve as an imaging device 210 of the system.

The present disclosure contains subject matter related to that disclosed in Japanese Priority Patent Application JP 2010-205786 filed in the Japan Patent Office on Sep. 14, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A power gate circuit comprising:
a power gate switch connected at least between a reference potential terminal of a circuit to be power-gated and a reference potential or between a power supply terminal of the circuit to be power-gated and a power supply;
a capacitor connected to a gate of the power gate switch;
a pulse generating section operable to supply a pulse signal to the gate of the power gate switch according to a control signal; and
a power gate control section operable to output the control signal to the pulse generating section to supply the pulse signal to the gate of the power gate switch when the power gate switch is turned on and accumulate electrical charges in the capacitor to control a gate potential of the power gate switch such that the potential gradually approaches a potential at which the power gate switch is turned on,
wherein the power gate control section sets the gate of the power gate switch to a constant potential instead of supplying the pulse signal after supplying the pulse signal for a predetermined period of time.

2. A power gate circuit according to claim 1, wherein the power gate control section is operable to change the pulse width of the pulse signal from the pulse generating section using the control signal.

3. A power gate circuit according to claim 2, wherein the power gate control section is operable to change the pulse width of the pulse signal from the pulse generating section using the control signal according to a mode signal.

4. A power gate circuit according to claim 1, further comprising a switch connected between the constant potential and the gate of the power gate switch, wherein the power gate control section turns the switch on to connect the gate of the power gate switch to the constant potential instead of supplying the pulse signal after supplying the pulse signal for a predetermined period of time.

5. A solid-state imaging device comprising:
a pixel section having a plurality of pixels performing photoelectric conversion arranged in the form of a matrix; and
a pixel signal readout section operable to read pixel signals from the pixel section, the pixels being read in groups each formed by a plurality of pixels, the pixel signal readout section comprising an AD conversion portion performing analog-digital (AD) conversion, wherein the pixel signal readout section comprises:
a plurality of comparators operable to compare a reference signal that is a ramp wave with the potential of an analog signal read out from a pixel of a column associated therewith,
a plurality of counter latches disposed in association with the plurality of comparators, capable of counting the comparison times of the respective comparators, the counter latches operable to stop counting and hold count values when the output of the respective comparators is inverted, and
a power gate circuit operable to serve the plurality of counter latch circuits,
the power gate circuit comprising:
a power gate switch connected at least between a reference potential terminal of a circuit to be power-gated and a reference potential or between a power supply terminal of the circuit to be power-gated and a power supply,
a capacitor connected to a gate of the power gate switch,
a pulse generating section operable to supply a pulse signal to the gate of the power gate switch according to a control signal, and
a power gate control section operable to output the control signal to the pulse generating section to supply the pulse signal to the gate of the power gate switch when the power gate switch is turned on and accumulate electrical charges in the capacitor to control a gate potential of the power gate switch such that the potential gradually approaches a potential at which the power gate switch is turned on,
wherein the power gate control section is operable to set the gate of the power gate switch to a constant potential instead of supplying the pulse signal after supplying the pulse signal for a predetermined period of time.

6. A solid-state imaging device according to claim 5, wherein the power gate control section is operable to change the pulse width of the pulse signal from the pulse generating section using the control signal.

7. A solid-state imaging device according to claim 6, wherein the power gate control section is operable to change the pulse width of the pulse signal from the pulse generating section using the control signal according to a mode signal.

8. A solid-state imaging device according to claim 5, further comprising a switch connected between the constant potential and the gate of the power gate switch, wherein the power gate control section turns the switch on to connect the gate of the power gate switch to the constant potential instead of supplying the pulse signal after supplying the pulse signal for a predetermined period of time.

9. A camera system comprising:
a solid-state imaging device; and
an optical system operable to form an object image on the solid-state imaging element, the solid-state imaging device comprising:
a pixel section comprising a plurality of pixels performing photoelectric conversion arranged in the form of a matrix, and
a pixel signal readout section operable to read pixel signals from the pixel section, the pixels being read in groups each formed by a plurality of pixels, the pixel signal readout section comprising an AD conversion portion performing analog digital (AD) conversion, the pixel signal readout section further comprising:
a plurality of comparators comparing a reference signal with the potential of an analog signal read out from a pixel of a column associated therewith in the pixel section,
a plurality of counter latches disposed in association with the plurality of comparators, capable of counting the comparison times of the respective comparators, the counter latches operable to stop counting and hold count values when the output of the respective comparators is inverted, and
a power gate circuit operable to serve the plurality of counter latch circuits,
the power gate circuit comprising:
a power gate switch connected at least between a reference potential terminal of a circuit to be power-gated and a reference potential or between a power supply terminal of the circuit to be power-gated and a power supply, a capacitor connected to a gate of the power gate switch, a pulse generating section operable to supply a pulse signal to the gate of the power gate switch according to a control signal, and a power gate control section operable to output the control signal to the pulse generating section to supply the pulse signal to the gate of the power gate switch when the power gate switch is turned on, wherein the power gate control section is operable to change the pulse width of the pulse signal from the pulse generating section using the control signal.

10. The camera system according to claim 9, wherein the power gate control section is operable to accumulate electrical charges in the capacitor to control a gate potential of the power gate switch such that the potential gradually approaches a potential at which the power gate switch is turned on.

11. The camera system according to claim 9, wherein the power gate control section is operable to change the pulse width of the pulse signal from the pulse generating section using the control signal according to a mode signal.

* * * * *